(12) United States Patent
Rogers

(10) Patent No.: US 8,866,556 B2
(45) Date of Patent: Oct. 21, 2014

(54) PHASE SHIFT PHASE LOCKED LOOP

(75) Inventor: Alan C. Rogers, Palo Alto, CA (US)

(73) Assignee: Analog Bits, Inc., Mountain View, CA (US)

(*) Notice: Subject to any disclaimer, the term of this patent is extended or adjusted under 35 U.S.C. 154(b) by 0 days.

(21) Appl. No.: 12/395,209

(22) Filed: Feb. 27, 2009

(65) Prior Publication Data

US 2010/0219894 A1    Sep. 2, 2010

(51) Int. Cl.
| | | |
|---|---|---|
| H03L 7/085 | (2006.01) | |
| H03L 7/089 | (2006.01) | |
| H03L 7/081 | (2006.01) | |
| H03L 7/087 | (2006.01) | |
| H03L 7/07 | (2006.01) | |
| H04J 3/06 | (2006.01) | |

(52) U.S. Cl.
CPC ............... *H03L 7/081* (2013.01); *H03L 7/087* (2013.01); *H03L 7/07* (2013.01); *H04J 3/0685* (2013.01)
USPC .............. 331/1 A; 331/16; 331/135; 331/175; 331/177 R; 375/376

(58) Field of Classification Search
CPC ......... H04J 3/0685; H03L 7/07; H03L 7/081; H03L 7/087
USPC ......... 331/1 A, 16, 135, 175, 177 R; 375/376
See application file for complete search history.

(56) References Cited

U.S. PATENT DOCUMENTS

| | | |
|---|---|---|
| 5,028,818 A | 7/1991 | Go Ang et al. |
| 5,032,743 A | 7/1991 | Rogers |
| 5,049,763 A | 9/1991 | Rogers |
| 5,061,864 A | 10/1991 | Rogers |
| 5,087,841 A | 2/1992 | Rogers |
| 5,149,991 A | 9/1992 | Rogers |
| 5,191,239 A | 3/1993 | Rogers |
| 5,199,002 A | 3/1993 | Ang et al. |
| 5,220,293 A | 6/1993 | Rogers |
| 5,228,106 A | 7/1993 | Ang et al. |
| 5,260,902 A | 11/1993 | Pilling et al. |
| 5,289,040 A | 2/1994 | Rogers |
| 5,300,832 A | 4/1994 | Rogers |
| 5,325,335 A | 6/1994 | Ang et al. |
| 5,355,032 A | 10/1994 | Rogers et al. |
| 5,371,425 A | 12/1994 | Rogers |
| 5,376,829 A | 12/1994 | Rogers et al. |
| 5,406,143 A | 4/1995 | Ang |
| 5,426,380 A | 6/1995 | Rogers |

(Continued)

*Primary Examiner* — Arnold Kinkead
*Assistant Examiner* — Richard Tan
(74) *Attorney, Agent, or Firm* — Blakely Sokoloff Taylor & Zafman LLP

(57) ABSTRACT

A phase shift phase locked loop (PSPLL) are described. The phase shift PLL includes a PLL and a phase adjusting circuit coupled to the inputs of the PLL. The phase adjusting circuit has a first input, a first output, a second input, a third input, and a second output. The first output and the second output are coupled to a first input and a second input of the PLL, respectively. The second input of the phase adjusting circuit receives a feedback signal and the third input of the phase adjusting circuit receives a control signal. The phase adjusting circuit receives a reference signal and sends a first output signal and a second output signal based on the reference signal to the PLL to adjust a phase of an output signal of the PLL in an increment less than a time period of the output signal of the PLL.

9 Claims, 6 Drawing Sheets

(56) References Cited

U.S. PATENT DOCUMENTS

| | | |
|---|---|---|
| 5,510,733 A | 4/1996 | Rogers et al. |
| 5,548,620 A | 8/1996 | Rogers et al. |
| 5,592,370 A | 1/1997 | Rogers |
| 5,596,293 A | 1/1997 | Rogers et al. |
| 5,598,035 A | 1/1997 | Rusu et al. |
| 5,600,272 A | 2/1997 | Rogers |
| 5,629,613 A | 5/1997 | Marzolf et al. |
| 5,642,325 A | 6/1997 | Ang |
| 5,668,765 A | 9/1997 | Ang |
| 5,675,298 A | 10/1997 | Bhagwan et al. |
| 5,781,781 A | 7/1998 | Marzolf et al. |
| 5,787,302 A | 7/1998 | Hampapuram et al. |
| 5,826,054 A | 10/1998 | Jacobs et al. |
| 5,852,741 A | 12/1998 | Jacobs et al. |
| 5,862,398 A | 1/1999 | Hampapuram et al. |
| 5,889,417 A | 3/1999 | Klass et al. |
| 5,942,918 A | 8/1999 | Ang et al. |
| 5,942,919 A | 8/1999 | Ang et al. |
| 5,973,547 A | 10/1999 | Ang et al. |
| 5,982,210 A | 11/1999 | Rogers |
| 5,983,013 A | 11/1999 | Rogers et al. |
| 6,018,254 A | 1/2000 | Rogers et al. |
| 6,028,417 A | 2/2000 | Ang et al. |
| 6,037,833 A | 3/2000 | Ang |
| 6,069,521 A | 5/2000 | Taylor et al. |
| 6,131,152 A | 10/2000 | Ang et al. |
| 6,160,456 A * | 12/2000 | Chang .............................. 331/25 |
| 6,198,325 B1 | 3/2001 | Ang et al. |
| 6,262,608 B1 | 7/2001 | O'Hearcain et al. |
| 6,281,714 B1 | 8/2001 | Ang et al. |
| 6,281,729 B1 | 8/2001 | Ang et al. |
| 6,294,924 B1 | 9/2001 | Ang et al. |
| 6,297,677 B1 | 10/2001 | Ang et al. |
| 6,301,146 B1 | 10/2001 | Ang et al. |
| 6,316,957 B1 | 11/2001 | Ang et al. |
| 6,339,351 B1 | 1/2002 | Ang et al. |
| 6,356,122 B2 * | 3/2002 | Sevalia et al. ................. 327/105 |
| 6,366,139 B1 | 4/2002 | Ang et al. |
| 6,411,131 B1 | 6/2002 | Ang et al. |
| 6,420,913 B1 | 7/2002 | Ang et al. |
| 6,462,623 B1 | 10/2002 | Horan et al. |
| 6,704,859 B1 | 3/2004 | Jacobs et al. |
| 6,952,138 B2 * | 10/2005 | Hagberg et al. ................. 331/25 |
| 6,967,536 B2 * | 11/2005 | Hayashida et al. ........... 331/1 A |
| 7,026,878 B2 * | 4/2006 | Smith ............................ 331/1 A |
| 7,242,229 B1 * | 7/2007 | Starr et al. ..................... 327/156 |
| 7,394,322 B2 | 7/2008 | Beeson ............................. 331/16 |
| 7,449,968 B1 * | 11/2008 | Cioffi et al. ................... 331/154 |
| 7,764,095 B2 * | 7/2010 | Werner et al. ................. 327/158 |
| 2004/0181648 A1 | 9/2004 | Jacobs et al. |
| 2006/0082402 A1 * | 4/2006 | Knotts ........................... 327/156 |
| 2006/0294410 A1 * | 12/2006 | Kizer et al. .................... 713/500 |
| 2007/0013427 A1 * | 1/2007 | Nomura ........................ 327/276 |
| 2008/0231333 A1 * | 9/2008 | Huang .......................... 327/157 |

\* cited by examiner

PHASE SHIFT PHASE LOCKED LOOP

TECHNICAL FIELD

The present invention relates generally to integrated circuits (ICs), and more particularly, to phase locked loops (PLL).

BACKGROUND

A PLL is an important and widely used electronic component. Broadly speaking, a PLL includes a circuit for synchronizing an output signal with an input signal (also often referred to as a reference signal or the reference clock signal) in terms of frequency and/or phase. When the reference signal and the output signal are synchronized, they may be referred to as being locked.

One conventional PLL typically includes a voltage or current controlled oscillator (VCO, ICO) to generate the output signal in response to the reference signal. In addition, a feedback signal related to the output signal is provided to the PLL as another input. The feedback mechanism of the PLL generally tries to make the feedback signal look like the reference signal in time. In particular, the PLL typically adjusts itself to make the rise in edges of the feedback signal and the reference signal occur substantially together.

One common application of PLLs is in data input/output (I/O). Typically, a clock signal and some data are received at an I/O interface. In order to properly strobe or sample the data, the clock signal has to be appropriately lined up with the data. To do so, the I/O interface may use a conventional PLL to adjust the phase of the clock signal received. In addition, the I/O interface may include one or more dividers to increase the frequency of the clock signal. Generally speaking, the phase ($\Theta$) of an output signal of the conventional PLL is related to the angular frequency ($\omega$) of the VCO by: $\Theta=\omega*t$, where t is time. For t=a time period (T) of the output signal, $\Theta=2\pi$. Thus, the conventional PLL may adjust the clock signal by $2\pi$ readily.

However, it is generally difficult for the conventional PLL to adjust the clock signal more finely, such as by increments less than the time period (T) of the output signal. Although one conventional approach is to run the VCO within the PLL faster in order to achieve a finer adjustment in phase, this approach generally requires more power, and may be further limited by the maximum speed the dividers or the VCO can run.

Another conventional approach is to bring out many phases of the VCO and then tap an output out of a number of outputs through different phases. Note that the outputs are phase related. However, this approach heavily depends on process matching of various components within the VCO, tapping structure, etc., over process, voltage and temperature, such mismatch becomes more significant as the VCO gets faster or the number of phases gets larger.

Alternatively, another conventional approach is to add delay blocks to the PLL in relation to the period of the VCO. However, this approach also suffers the same disadvantage of being heavily dependent on process matching. Generally, the delay blocks do not match very well. Furthermore, it is cumbersome to add many delay blocks to the PLL.

BRIEF DESCRIPTION OF THE DRAWINGS

The present invention will be understood more fully from the detailed description that follows and from the accompanying drawings, which however, should not be taken to limit the appended claims to the specific embodiments shown, but are for explanation and understanding only.

DETAILED DESCRIPTION

In the following description, numerous specific details are set forth. However, it is understood that embodiments of the invention may be practiced without these specific details. In other instances, well-known circuits, structures, and techniques have not been shown in detail in order not to obscure the understanding of this description.

Reference in the specification to "some embodiments" or "an embodiment" means that a particular feature, structure, or characteristic described in connection with the embodiment(s) is included in at least one embodiment of the invention. The appearances of the phrase "in some embodiments" in various places in the specification do not necessarily all refer to the same embodiment.

In some embodiments, the phase shift phase locked loop (Phase-Shift-PLL, or PSPLL) includes a PLL and a phase adjusting circuit coupled to the inputs of the PLL. The phase adjusting circuit has a first input, a first output, a second input, a second output and a third input. The first output and the second output are coupled to a first input and a second input of the PLL, respectively. The phase adjusting circuit receives a reference signal and a feedback signal and generates a first output signal and a second output signal based on the reference signal, feedback signal, and control signal. Both output signals from the phase adjusting circuit are input to the PLL to adjust a phase of an output signal of the PLL in an increment less than a time period of the output signal of the PLL. As such, the phase of the output signal of the PSPLL may be adjusted more finely than many conventional PLLs.

Figure 1:
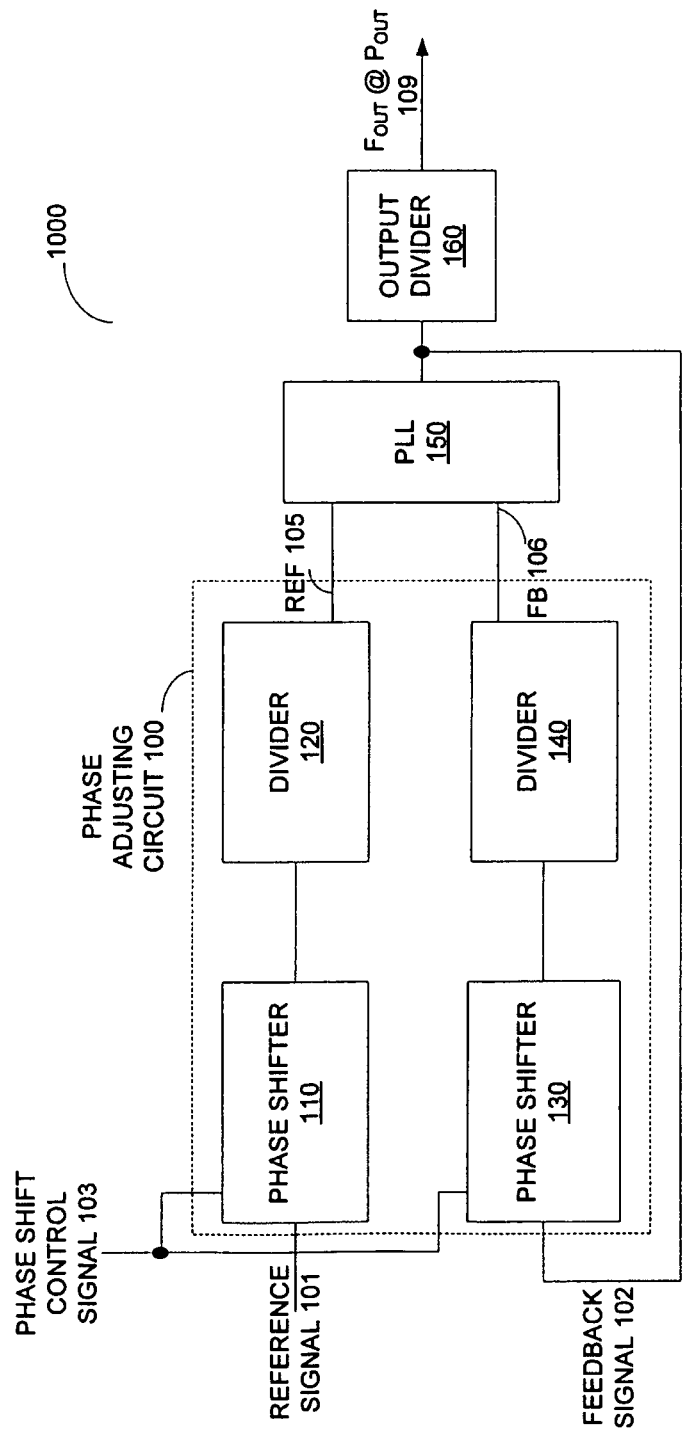
FIG. 1 shows one embodiment of a phase shift PLL.

FIG. 1 shows one embodiment of a Phase-Shift-PLL. The Phase-Shift-PLL 1000 includes a PLL 150, an output divider 160, and a phase adjusting circuit 100, which further includes two phase shifters 110 and 130, two dividers 120 and 140. Note that any or all of the components and the associated hardware illustrated in FIG. 1 may be used in various embodiments of the Phase-Shift-PLL 1000. However, it should be appreciated that other configurations of the Phase-Shift-PLL 1000 may include more or less devices than those shown in FIG. 1.

In some embodiments, a first input of the phase shifter 110 receives a reference signal 101 and a second input of the phase shifter 110 receives a phase shift control signal 103. An output of the phase shifter 110 is coupled to an input of the divider 120. An output of the divider 120 is coupled to a first input of the PLL 150. Likewise, a first input of the phase shifter 130 receives a feedback signal 102 from the PLL 150 and a second input of the phase shifter 110 receives the phase shift control signal 103. An output of the phase shifter 130 is coupled to an input of the divider 140. An output of the divider 140 is coupled to a second input of the PLL 150. The PLL 150 may be of various types (e.g., linear PLL, digital PLL, etc.). More details of one embodiment of the PLL 150 are described below with reference to FIG. 2. Alternatively, the PLL 150 may be a fully digital PLL. An output of the PLL 150 is coupled to the first input of the phase shifter 130 and an input of the output divider 160. The output divider 160 outputs a signal $F_{out}$ 109 at phase, $P_{out}$.

To further illustrate the concept of the Phase-Shift-PLL 1000, some exemplary frequencies and values are used in the discussion below. However, it should be apparent that embodiments of the present invention are not limited to these frequencies and/or values. In some embodiments, the reference signal 101 is at 1 GHz. The reference signal 101 may be generated by another circuit block, for instance, another PLL (not shown). The phase shifter 110 may increment the phase of the reference clock signal 101. Likewise, the phase shifter 130 receives the feedback signal 102 and may increment the phase of the feedback signal 102. In some embodiments, the feedback signal 102 has a frequency of about 975 MHz. Then the phase shifters 110 and 130 forward the reference signal 101 and the feedback signal 102 to the dividers 120 and 140, respectively.

In some embodiments, the dividers 120 and 140 divide the reference signal 101 and the feedback signal 102 forwarded from the phase shifters 110 and 130, respectively, with different values. For instance, the divider 120 may divide the reference signal 101 by 40 while the divider 140 may divide the feedback signal 102 by 39. As such, the frequency of the 1000 MHz reference signal 101 is brought down to 25 MHz at REF 105 and the frequency of the 975 MHz feedback signal 102 is brought down to 25 MHz at FB 106. The outputs of the dividers 120 and 140 are input to the PLL 150. In the case that PHASE SHIFTERs 110 and 130 both execute a 1 cycle phase shift then the difference between the periods of the reference signal 101 and feedback signal 102 is forwarded to the PLL 150. Thus, a very small and precise time offset may be created and used.

As a mathematical example of the phase shift operation according to one embodiment, consider the PSPLL 1000 shown in FIG. 1. If, for example, the reference signal 101 is at 1 GHz, the divider 120 is set to divide-by-40, so that the REF signal 105 is at 25 MHz; the FB signal 106 will by the nature of the PLL control loop be equally 25 MHz, and if the divider 140 is set to divide-by-39, then the feedback signal 102 will be 975 MHz. If the phase shifters 110 and 130 each shift their outputs one cycle of their input clocks (which is similar to skipping one cycle of their outputs), then the subsequent REF 105 signal will be delayed by one cycle of the 1 GHz clock (i.e., 1.000 ns) and the subsequent FB signal 106 will be delayed by one cycle of the 975 MHz clock (i.e., 1.025 ns). Thus, the PLL 150 may see an input shift of about 25 ps and subsequently, may adjust itself for this shift. Therefore, the output signal of the PSPLL 1000, i.e., Fout@Pout 109 will be shifted by 25 ps. Note that this 25 ps phase shift is about 40 time smaller than the cycle time of the output of the PLL 150.

Alternatively, reference signals at another frequency and other divider values may be used, provided the frequencies and values remain in a harmonic relationship. For instance, for a reference signal at 2 GHz, a divider value of 80 may be used at the divider 120.

Note that the Phase-Shift-PLL 1000 may create very fine steps (such as 25 psec steps) by performing a phase shift in a single cycle. Furthermore, when a phase shift is done in every cycle, the Phase-Shift-PLL 1000 may achieve a fine frequency shift (e.g., 25 psec, 40 nsec, etc.).

In an alternate embodiment, a first variable divider (a.k.a. variable programmable divider) may replace the phase shifter 110 and the divider 130. Likewise, a second variable divider may replace the phase shifter 120 and the divider 140. The phase shift control signal 103 may be input to the first and the second variable dividers to program these variable dividers at different values. For example, +1 may be input to the first variable divider and the second variable divider to change the divider value from 40 to 41, and from 39 to 40, respectively. In some embodiments, the phase shift control signal 103 is internally generated to achieve a fixed frequency change. Note that the reference signal 101 and the feedback signal 102 may be divided by greater offsets for greater phase shifts (e.g., +2, +3, etc.). Alternatively, the reference signal 101 and the feedback signal 102 may be divided by negative numbers for opposite phase shift (e.g., −1, −2, etc.). In some embodiments, the first and second variable dividers may be dithered to achieve intermediate phase shifts. Furthermore, the divide changes may be applied more or less often for frequency shifts.

In some embodiments, the Phase-Shift-PLL 1000 is a digital design, where control signals are either ones or zeros. Therefore, the Phase-Shift-PLL 1000 is substantially process independent. In other words, the performance of the Phase-Shift-PLL 1000 does not rely on process matching, which is a great advantage over some conventional approaches in phase shifting discussed above.

Figure 2:
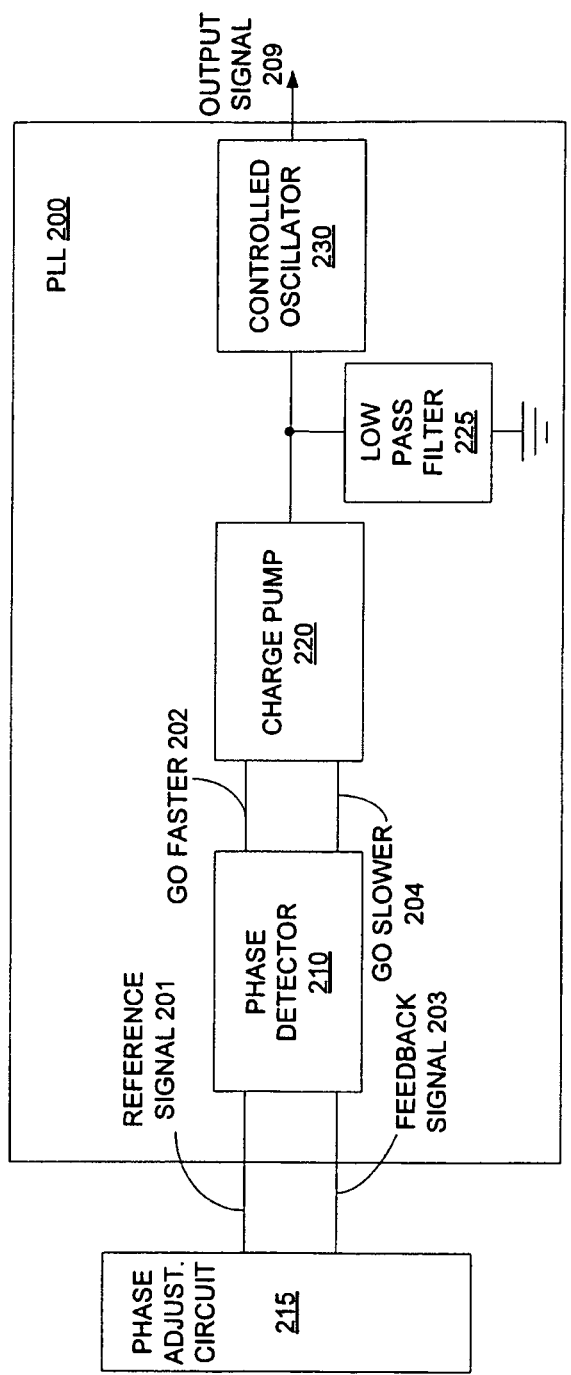
FIG. 2 shows one embodiment of a PLL usable in some embodiments of the present invention.

FIG. 2 shows one embodiment of a PLL usable in some embodiments of the Phase-Shift-PLL 1000. The PLL 200 is coupled to a phase adjusting circuit 215. Details of some embodiments of the phase adjusting circuit 215 have been described above. The PLL 200 includes a phase detector 210, a charge pump 220, a controlled oscillator 230, and a low pass filter 225. The phase detector 210 receives a reference signal 201 and a feedback signal 203 from the phase adjusting circuit 215. The phase detector 210 then outputs two signals to the charge pump 220, which outputs a signal to the controlled oscillator 230. One of the two signals from the phase detector 210 causes the charge pump 220 to inject charge into the low pass filter 225 in such a way as to cause the controlled oscillator 230 to oscillate faster, and thus, is referred to as the "GO FASTER" signal 202. Reciprocally, the other one of the two signals causes the controlled oscillator 230 to oscillate slower, and thus, is referred to as the "GO SLOWER" signal 204. The controlled oscillator 230 may include a voltage controlled oscillator (VCO), a current controlled oscillator (CCO), or a numerical controlled oscillator (NCO).

In some embodiments, the controlled oscillator 230 outputs an output signal 209 based on the reference signal 201 and the feedback signal 203. Specifically, the phase detector 210 detects the difference between the reference signal 201 and the feedback signal 203 from the phase adjusting circuit 215. If the feedback signal 203 is either too late or too early with respect to the reference signal 201, then the phase detector 210 may assert the "GO FASTER" signal 202 or the "GO SLOWER" signal 204 to the charge pump 220. The charge pump 220 may generate an up current and/or a down current depending on whether the "GO FASTER" signal 202 or the "GO SLOWER" signal 204 is asserted, and then accumulate the corresponding charge in the low pass filter 225. For example, referring to FIG. 2, the low pass filter 225 may accumulate the up current or the down current, which is then used to drive the controlled oscillator 230.

Note that the components in the PLL 200, including the phase detector 210, the charge pump 220, the low pass filter 225, and the controlled oscillator 230 may be implemented using analog circuits, digital circuits, or a combination of both. For instance, the phase detector 210 may be implemented using analog circuits, while the controlled oscillator is digital.

Figure 3:
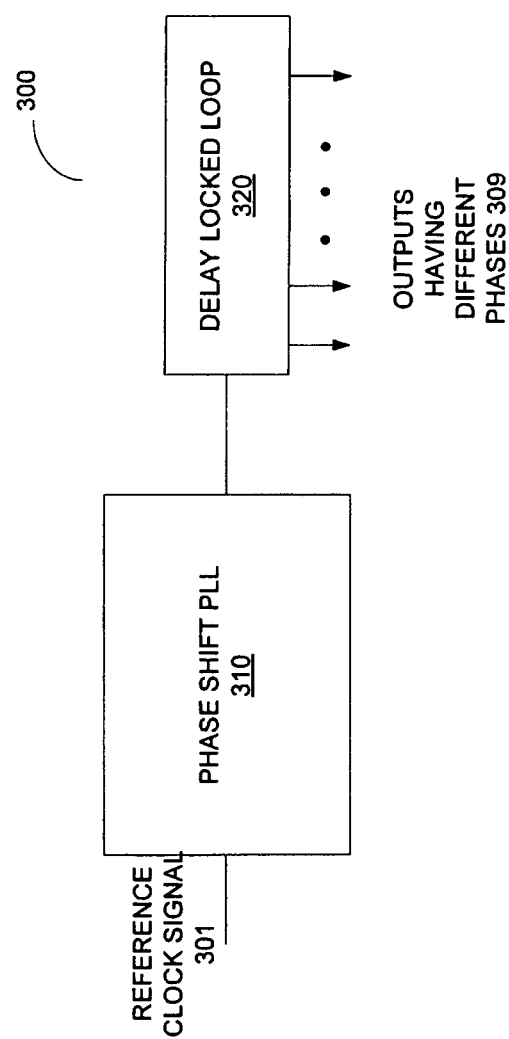
FIG. 3 shows one embodiment of a phase shift PLL usable with one embodiment of a delay locked loop (DLL).

FIG. 3 shows one embodiment of a Phase-Shift-PLL usable with one embodiment of a delay locked loop (DLL).

Referring to FIG. 3, a Phase-Shift-PLL 310, such as the Phase-Shift-PLL 1000 described with reference to FIG. 1, is coupled to a DLL 320. The DLL 320 has a number of outputs 309 having different phases. The number of outputs of the DLL 320 may vary from one embodiment to another, such as 4, 8, 16, etc.

In some embodiments, the DLL 320 may further shift the phase of the output signal from the Phase-Shift-PLL 310 by predetermined increments to generate the output signals 309 at different phases. As such, by further processing the output signal of the Phase-Shift-PLL 310 using the DLL 320, the phase shift created in the output signal of the Phase-Shift-PLL 310 may be fine-tuned by the DLL 320.

Figure 4:
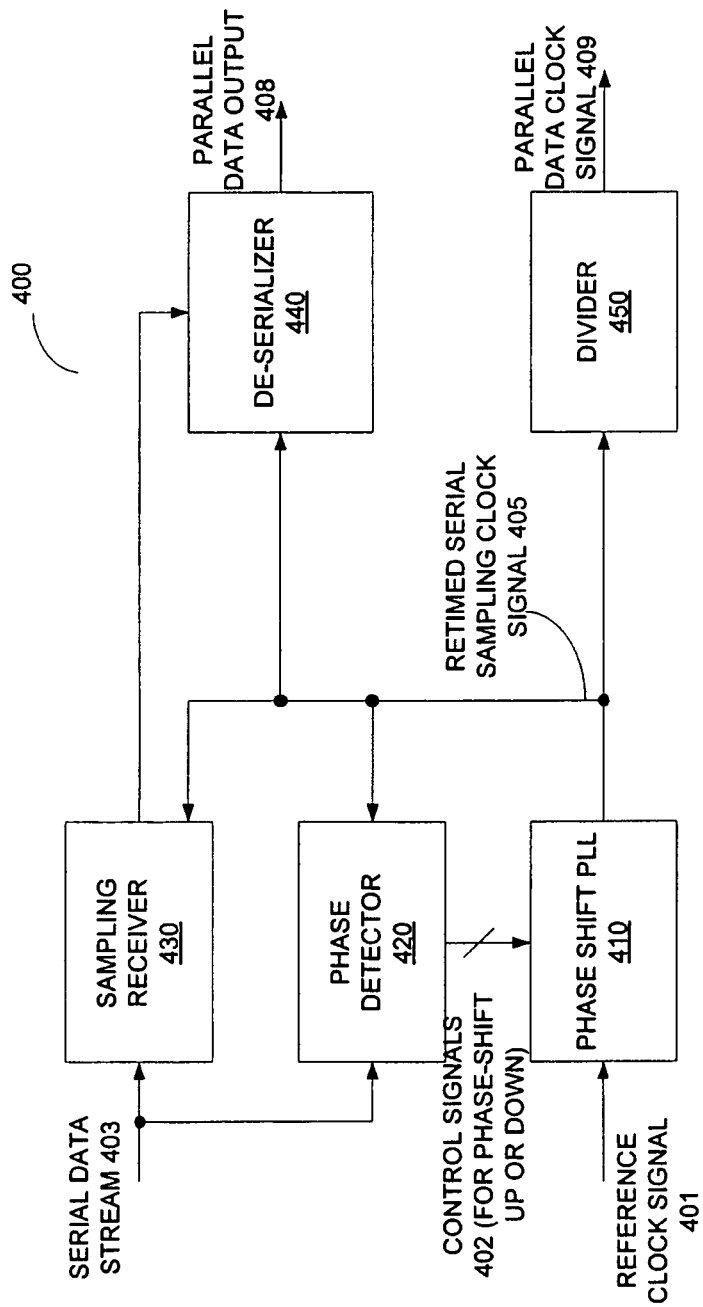
FIG. 4 shows one embodiment of a clock/data recovery system for serial data communications.

FIG. 4 shows one embodiment of a clock/data recovery system for serial data communications. The system 400 includes a Phase-Shift-PLL 410, a phase detector 420, a sampling receiver 430, a de-serializer 440, and a divider 450. One input of the Phase-Shift-PLL 410 receives a reference clock signal 401. The Phase-Shift-PLL 410 has an output coupled to the phase detector 420, the sampling receiver 430, and the divider 450. The Phase-Shift-PLL 410 shifts the phase of the reference clock signal 401 to output a retimed serial sampling clock signal 405. Retimed serial sampling clock signal 405 may be comprised of several phases, e.g., a sampling phase and a detecting phase which are suitably phase offset by a fixed amount with respect to one another, where as the phase detector 420 might make decisions by comparison of serial data stream 403 with the detect phase of signal 405, the sampling receiver 430 might sample the serial data stream 403 by using the sampling phase of signal 405. Details of some embodiments of the Phase-Shift-PLL 410 have been described above.

In some embodiments, the phase detector 420 has one input to receive the serial data stream 403 and another input to receive the retimed serial sampling clock signal 405 from the Phase-Shift-PLL 410. Likewise, the sampling receiver 430 also has one input to receive the serial data stream 403 and another input to receive the retimed serial sampling clock signal 405. An output of the sampling receiver 430 is coupled to the input of the de-serializer 440. In addition, the de-serializer 440 receives the retimed serial sampling clock signal 405, and outputs parallel data 408.

The divider 450 divides the retimed serial sampling clock signal 405 from the Phase-Shift-PLL 410 to produce a parallel data clock signal 409. Other inputs of the Phase-Shift-PLL 410 are coupled to the outputs of the phase detector 420 to receive control signals from the phase detector 420. By providing a fine and precise timing offset to the reference clock signal 401, the Phase-Shift-PLL 410 may be used in the clock generator of the clock/data recovery system 400 to adjust the phase of reference clock signal 401 to align with data in the serial data stream 403.

Figure 5:
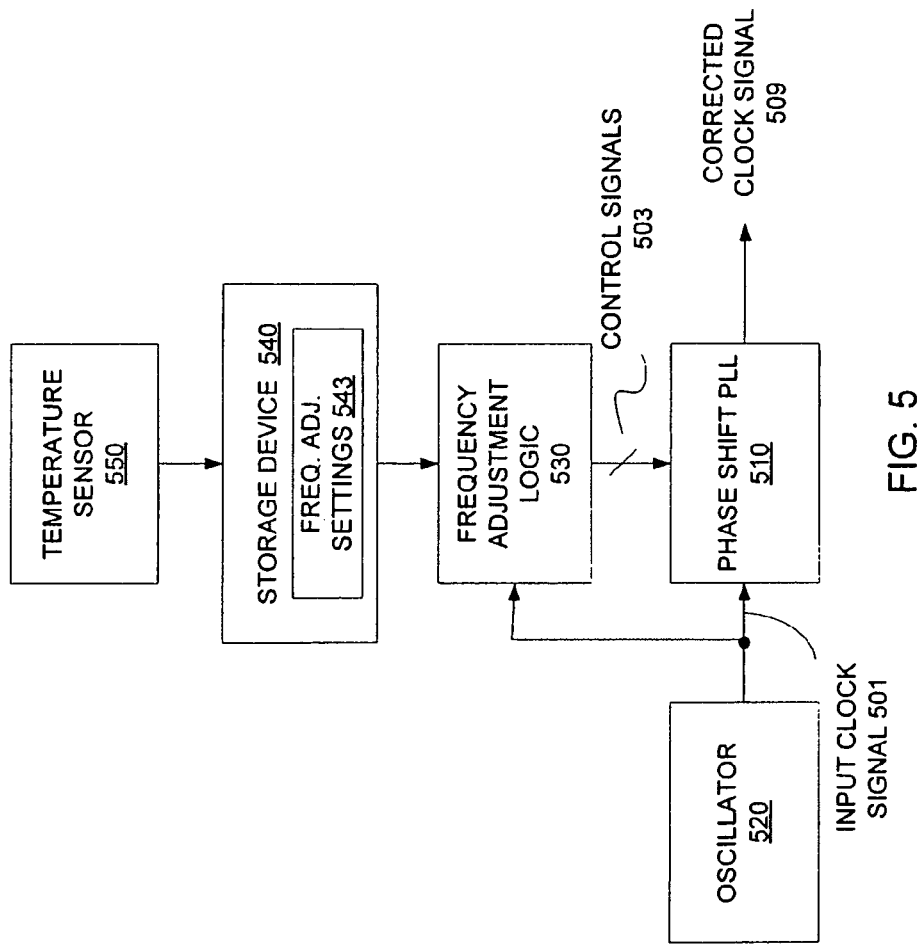
FIG. 5 shows one embodiment of a clock trimming circuit.

FIG. 5 shows one embodiment of a clock trimming circuit. The clock trimming circuit 500 includes a Phase-Shift-PLL 510, an oscillator 520, frequency adjustment logic 530, a storage device 540, and a temperature sensor 550. Details of some embodiments of the Phase-Shift-PLL 510 have been described above. In some embodiments, the oscillator 520 includes a crystal oscillator. Alternatively, the oscillator 520 includes a micro-electromechanical system (MEMS) oscillator. Other embodiments may include other types of oscillators. The oscillator 520 generates an input clock signal 501, which is input to the Phase-Shift-PLL 511 as well as the frequency adjustment logic 530. The frequency adjustment logic 530 generates a set of control signals 503, which are input to the Phase-Shift-PLL 510. The control signals 503 may include phase shift up/down control signals and/or divider values. The frequency adjustment logic 530 further receives inputs from the storage device 540. The storage device 540 stores a set of predetermined frequency adjustment settings 543. Based on input from the temperature sensor 550, the corresponding frequency adjustment settings are retrieved from the set 543 and are forwarded to the frequency adjustment logic 530. The frequency adjustment logic 530 then generates the control signals 503 based on the frequency adjustment settings from the storage device 540, and provides the control signals 503 to the Phase-Shift-PLL 510 to adjust the frequency accordingly. The fine frequency adjustment is achieved by repeatedly and regularly executing phase adjustments within the PSPLL.

In some embodiments, the Phase-Shift-PLL 510 creates a fine and precise timing offset from the input clock signal 501 based on the control signals 503 from the frequency adjustment logic 530. As such, the Phase-Shift-PLL 510 trims the input clock signal 501 to generate a corrected clock signal 509.

Figure 6:
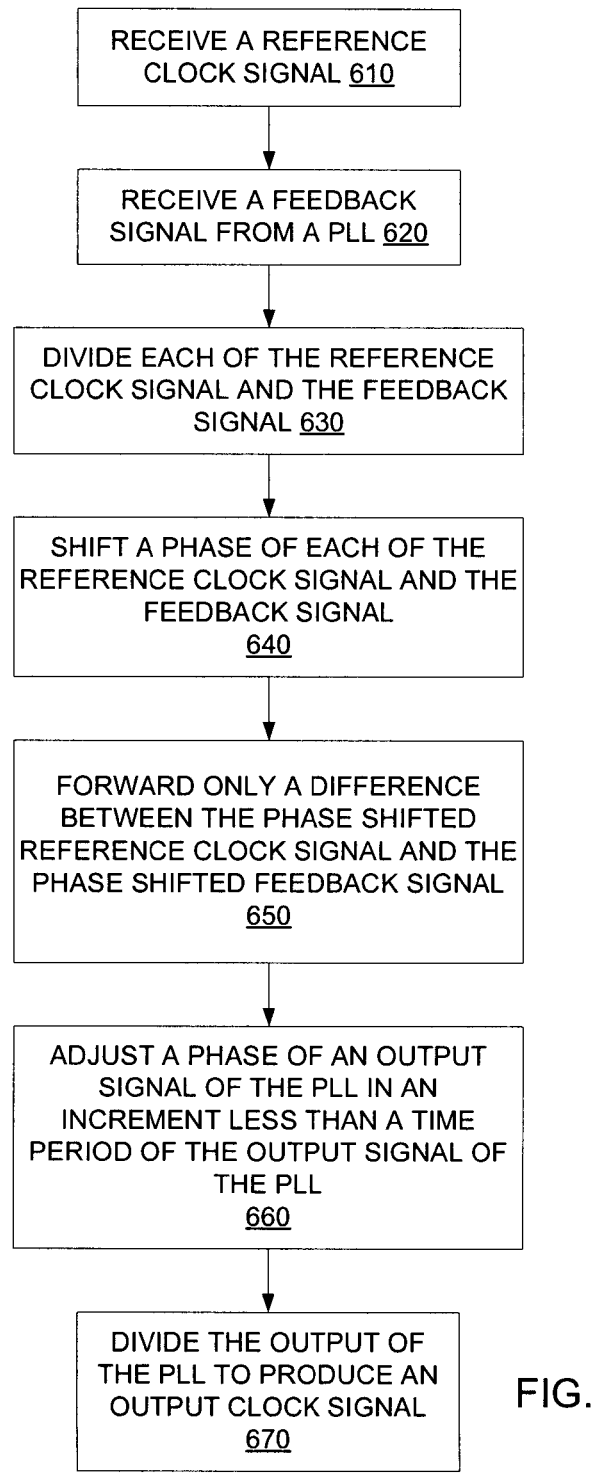
FIG. 6 shows one embodiment of a process to adjust a phase of an output signal of a phase shift PLL.

FIG. 6 shows one embodiment of a process to finely adjust a phase of an output signal of a Phase-Shift-PLL. The process is performed by processing logic that may comprise hardware (e.g., circuitry, dedicated logic, etc.), software (such as is run on a general-purpose computer system, a server, or a dedicated machine), or a combination of both. For example, some or all of the operations in the process may be performed by some embodiments of the Phase-Shift-PLL described above.

In one embodiment, processing logic receives a reference clock signal at a reference frequency (processing block 610). Processing logic further receives a feedback signal from a PLL (processing block 620). Then processing logic divides each of the reference clock signal and the feedback signal by two predetermined factors (processing block 630). Processing logic further shifts a phase of each of the reference clock signal and the feedback signal (processing block 640).

Processing logic forwards only a difference between the phase shifted reference clock signal and the phase shifted feedback signal to the PLL (processing block 650). For example, processing logic may divide the phase shifted reference clock signal and the phase shifted feedback signal by two slightly different predetermined factors to create a small difference in phase between the phase shifted reference clock signal and the phase shifted feedback signal. Then processing logic adjusts a phase of an output signal of the PLL in an increment less than a time period of the output signal of the PLL (processing block 660). Finally, processing logic divides the output of the PLL to produce an output clock signal, whose phase is precisely shifted from the reference clock signal received earlier (processing block 670).

Note that other embodiments of the process may or may not include every operation described above. Furthermore, the order of performing some or all of the above operations may vary from one embodiment to another.

The foregoing discussion merely describes some exemplary embodiments of a Phase-Shift-PLL. One skilled in the art will readily recognize from such discussion, the accompanying drawings, and the claims that various modifications can be made without departing from the spirit and scope of the appended claims. The description is thus to be regarded as illustrative instead of limiting.

What is claimed is:
1. An electronic circuit, comprising:
a phase lock loop circuit including a feedback path that flows from an output of an oscillator of said phase lock loop circuit to a first input of a phase detector of said phase lock loop circuit, said feedback path including a first phase shift circuit and a first divider, said first divider between said first phase shift circuit and said first input of said phase detector, said first phase shift circuit to shift a digital feedback signal's phase in one or more increments of said digital feedback signal's cycle time such that said shift of said digital feedback signal's phase is substantially not a function of manufacturing process variations and is substantially not a function of voltage and temperature variations;

a reference path that flows into a second input of said phase detector of said phase lock loop circuit, said reference path including a second phase shift circuit and a second divider, said second divider between said second input of said phase detector of said phase lock loop circuit and said second phase shift circuit, said second phase shift circuit to shift a digital reference signal's phase in one or more increments of said digital reference signal's cycle time such that said shift of said digital reference signal's phase is substantially not a function of manufacturing process variations and is substantially not a function of voltage and temperature variations; and, a phase shift control signal feedback path that flows from said output of said oscillator into respective phase shift control inputs of said first and second phase shift circuits, the phase lock loop circuit including the feedback path, the reference path and the phase shift control signal feedback path to adjust a phase of a signal at said output of said oscillator in an increment less than a cycle time of said signal at said output of said oscillator responsive to said signal at said output of said oscillator, said increment being a function of a steady state difference between said digital feedback signal's cycle time and said digital reference signal's cycle time wherein said increment is substantially not a function of manufacturing process variations and is substantially not a function of voltage and temperature variations.

2. The electronic circuit of claim 1 wherein said first and second dividers have different divider ratios.

3. The electronic circuit of claim 1 further comprising a delay circuit coupled to the output of the oscillator, the delay circuit to provide signals derived from, and of varying delay with respect to, an output signal of said oscillator.

4. The electronic circuit of claim 1 further comprising a second phase detector having a first input to receive a serial stream of data and a second input through which said phase shift control feedback path flows.

5. The electronic circuit of claim 4 further comprising a sampling receiver circuit that receives said serial stream of data and said signal from said oscillator.

6. The electronic circuit of claim 1 further comprising a temperature sensor and a storage circuit to store temperature dependent frequency adjustment settings for said phase lock loop circuit.

7. A method, comprising:

adjusting a phase of an output signal of an oscillator of a phase lock loop in an increment less than a cycle time of the output signal of the oscillator by:

digitally adjusting a phase of a digital reference signal in one or more increments of said digital reference signal's cycle time such that said shift of said digital reference signal's phase is substantially not a function of manufacturing process variations and is substantially not a function of voltage and temperature variations, said digital reference signal's phase being adjusted before reducing said digital reference signal's frequency to produce a phase shifted and frequency reduced digital reference signal, said digitally adjusting of said phase of said digital reference signal being responsive to said output signal of said oscillator; and, providing said phase shifted and frequency reduced digital reference signal to a phase detector of said phase lock loop;

digitally adjusting a phase of a digital feedback signal in one or more increments of said digital feedback signal's cycle time such that said shift of said digital feedback signal's phase is substantially not a function of manufacturing process variations and is substantially not a function of voltage and temperature variations, said digital feedback signal's phase being adjusted before reducing said digital feedback signal's frequency to produce a phase shifted and frequency reduced digital feedback signal, said digitally adjusting of said phase of said digital feedback signal being responsive to said output signal of said oscillator; and, providing said phase shifted and frequency reduced digital feedback signal to said phase detector of said phase lock loop, a steady state difference existing between said digital reference signal's cycle time and said digital feedback signal's cycle time, said phase of said output signal of said oscillator being adjusted as a function of said difference such that said phase of said output signal of said oscillator is substantially not a function of manufacturing process variations and is substantially not a function of voltage and temperature variations.

8. The method of claim 7 wherein said adjusting of said respective phases of said digital feedback and digital reference signals is controlled with a same control signal.

9. The method of claim 7 wherein said frequency reduction of said digital reference signal and said frequency reduction of said digital feedback signal are effected with different frequency reduction factors.

* * * * *